US007002167B2

(12) United States Patent
Ogasawara

(10) Patent No.: US 7,002,167 B2
(45) Date of Patent: Feb. 21, 2006

(54) CHARGED-PARTICLE BEAM WRITER

(75) Inventor: Munehiro Ogasawara, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/665,285

(22) Filed: Sep. 22, 2003

(65) Prior Publication Data

US 2004/0089822 A1    May 13, 2004

(30) Foreign Application Priority Data

Sep. 30, 2002    (JP) ............................. 2002-285542

(51) Int. Cl.
    *H01J 37/08*    (2006.01)
(52) U.S. Cl. .............................................. 250/492.22
(58) Field of Classification Search ........... 250/492.22, 250/492.23, 492.2

See application file for complete search history.

(56) References Cited

U.S. PATENT DOCUMENTS

| | | | | |
|---|---|---|---|---|
| 4,469,950 A | * | 9/1984 | Taylor et al. | 250/492.2 |
| 5,283,440 A | * | 2/1994 | Sohda et al. | 250/492.2 |
| 6,274,290 B1 | * | 8/2001 | Veneklasen et al. | 430/296 |
| 6,333,138 B1 | * | 12/2001 | Higashikawa et al. | 430/296 |
| 6,429,440 B1 | * | 8/2002 | Bleeker | 250/492.1 |
| 6,597,001 B1 | * | 7/2003 | Yamashita et al. | 250/491.1 |
| 6,603,120 B1 | * | 8/2003 | Yamashita | 250/307 |

FOREIGN PATENT DOCUMENTS

| | | |
|---|---|---|
| JP | 7-61185 | 3/1995 |
| JP | 9-246148 | 9/1997 |
| JP | 9-289164 | 11/1997 |
| JP | 2001-34115 | 2/2001 |
| JP | 2001-217173 | 8/2001 |
| JP | 2002-203777 | 7/2002 |

OTHER PUBLICATIONS

N. Shimomura, et al., "Optical Column of Themask-Scan EB Mask Writer Test Stand", vol. 4066, pp. 605-612, SPIE, 2000.

* cited by examiner

*Primary Examiner*—Nikita Wells
*Assistant Examiner*—Anthony Quash
(74) *Attorney, Agent, or Firm*—Oblon, Spivak, McClelland, Maier & Neustadt, P.C.

(57) ABSTRACT

A charged-particle beam writer which draws a pattern on a specimen with a charged-particle beam generated from a single particle generator by both of a VSB strategy and a scan-projection strategy, the charged-particle beam writer comprising a data creating unit configured to create pattern data representing a state where a first-type figure drawn by the VSB strategy and a second-type figure drawn by the scan-projection strategy are arranged on the specimen, a computing unit configured to calculate, on the basis of the pattern data, the amount of correction for correcting the drawing dimensions of the first-type figure on the specimen and the drawing dimensions of the second-type figure on the specimen, and a control unit configured to control the dose of beam at each position on the specimen on the basis of the calculated amount of correction.

8 Claims, 6 Drawing Sheets

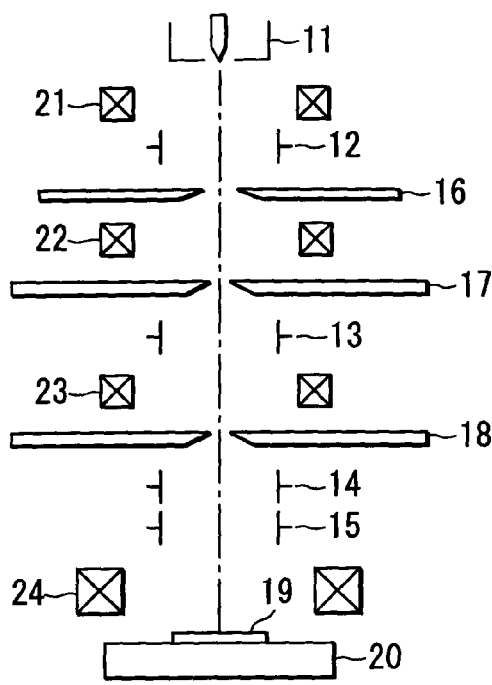
FIG. 1
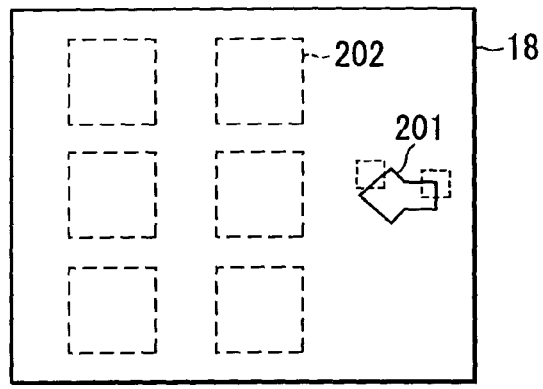
FIG. 2
FIG. 4
Character code 17~21:VSB  22~:Scan-projection
| | 1-20 | 21-40 | 41-52 | 53-64 |
|---|---|---|---|---|
| VSB | Character code | Blank | Blank | Blank |
| | X | X | Lx | Ly |
| Scan -projection | Character code | Nscan | px | py |
| | X | Y | Nx | Ny |

```
Character number
Character code address 0
Character code address 1
        :

Address 0  EB mask code   XB    YB    XF    YF

Address 1  EB mask code   XB    YB    XF    YF

Address 2  EB mask code   XB    YB    XF    YF

Address 3  EB mask code   XB    YB    XF    YF
        :
```

FIG. 5

```
                Dose table Dij
     1-16         17-32         33-48         49-64
      Nx           Ny             px            py
     (0, 0)       (0, 1)        (0, 2)        (0, 3)
                     :

| Transfer pattern data | 1-20 | 21-42 | 43-64 | |
|---|---|---|---|---|
| | Number of scanned character (NF) | | | |
| | Address for data on character code 22 | x-coordinate on EB mask at the origin of data on character code 22 | y-coordinate on EB mask at the origin of data on character code 22 | |
| | Address for data on character code 23 | x-coordinate on EB mask at the origin of data on character code 23 | y-coordinate on EB mask at the origin of data on character code 23 | |
| | ⋮ | | | |
| | Address for data on character code NF+21 | x-coordinate on EB mask at the origin of data on character code NF+21 | y-coordinate on EB mask at the origin of data on character code NF+21 | |

| Address for character code 22 | 1-16 | 17-32 | 18-48 | 49-64 |
|---|---|---|---|---|
| | S | xG | yG | |
| | nx | ny | px | py |
| | (0, 0) | (0, 1) | (0, 2) | (0, 3) |
| | (1, 0) | (1, 1) | (1, 2) | (1, 3) |
| | (2, 0) | (2, 1) | (2, 2) | (2, 3) |
| | ⋮ | | | |
| | (ny-1, 0) | (ny-1, 1) | (ny-1, 2) | (ny-1, 3) |
| | (0, 4) | (0, 5) | (0, 6) | (0, 7) |
| | (ny-1, 4) | (ny-1, 5) | (ny-1, 6) | (ny-1, 7) |
| | (0, 8) | (0, 9) | (0, 10) | (0, 10) |
| | ⋮ | | | |

| Address for character code 23 | (ny-1, nx-4) | (ny-1, nx-3) | (ny-1, nx-2) | (ny-1, nx-1) |
|---|---|---|---|---|
| | S | xG | yG | |
| | nx | ny | sx | sy |
| | (0, 0) | (0, 1) | (0, 2) | (0, 3) |
| | (1, 0) | (1, 1) | (1, 2) | (1, 3) |
| | (2, 0) | (2, 1) | (2, 2) | (2, 3) |
| | ⋮ | | | |
| | (ny-1, 0) | (ny-1, 1) | (ny-1, 2) | (ny-1, 3) |
| | (0, 4) | (0, 5) | (0, 6) | (0, 7) |
| | (ny-1, 4) | (ny-1, 5) | (ny-1, 6) | (ny-1, 7) |
| | (0, 8) | (0, 9) | (0, 10) | (0, 10) |
| | ⋮ | | | |
| | (ny-1, nx-4) | (ny-1, nx-3) | (ny-1, nx-2) | (ny-1, nx-1) |
| | ⋮ | | | |

FIG. 6

| Transfer pattern data | 1-20 | 21-42 | 43-64 | |
|---|---|---|---|---|
| | Number of scanned character (NF) | | | |
| | Address for data on character code 22 | x-coordinate on EB mask at the origin of data on character code 22 | y-coordinate on EB mask at the origin of data on character code 22 | |
| | Address for data on character code 23 | x-coordinate on EB mask at the origin of data on character code 23 | y-coordinate on EB mask at the origin of data on character code 23 | |
| | ⋮ | | | |
| | Address for data on character code NF+21 | x-coordinate on EB mask at the origin of data on character code NF+21 | y-coordinate on EB mask at the origin of data on character code NF+21 | |

| | 1-16 | 17-32 | 18-48 | 49-64 |
|---|---|---|---|---|
| Address for character code 22 | Number of character (n) | Total area | xG | yG |
| | Area of character 0 | x0 | y0 | |
| | nx | ny | px | px |
| | Area of character 1 | x0 | y0 | |
| | nx | ny | px | px |
| | Area of character 2 | x0 | y0 | |
| | nx | ny | px | py |
| | ⋮ | | | |
| | Area of character n-1 | x0 | y0 | |
| | nx | ny | px | |
| Address for character code 23 | Blank | | | |
| | Number of character (n) | S | xG | yG |
| | Area of character 0 | x0 | y0 | |
| | nx | ny | px | py |
| | Area of character 2 | x0 | y0 | |
| | nx | ny | px | py |
| | ⋮ | | | |
| | Area of character n-1 | x0 | y0 | |
| | nx | ny | px | py |
| | Blank | | | |

FIG. 7

CHARGED-PARTICLE BEAM WRITER

CROSS-REFERENCE TO RELATED APPLICATIONS

This application is based upon and claims the benefit of priority from the prior Japanese Patent Application No. 2002-285542, filed Sep. 30, 2002, the entire contents of which are incorporated herein by reference.

BACKGROUND OF THE INVENTION

1. Field of the Invention

This invention relates to a charged-particle beam writer used to write a microscopic pattern on a semiconductor wafer. In this type of apparatus, a pattern based on, for example, CAD (Computer-Aided Design) data is formed.

2. Description of the Related Art

In electron beam writers used in the process of fabricating semiconductor chips, it is important to increase the throughput. For this reason, a variable-shaped beam (VSB) strategy or a character projection strategy has been applied to this type of writer in recent years (refer to, for example, Jpn. Pat. Appln. KOKAI Publication No. 2002-237445). The variable-shaped beam strategy is to produce a beam whose cross section is rectangular, triangular, or of any other shape and draw a pattern on a semiconductor specimen with the produced beam. The character projection strategy is to prepare character data corresponding to a repetitive pattern on LSI (Large-Scale Integration) and draw a pattern on a semiconductor specimen by combining individual characters.

Use of the character projection strategy enables specific characters to be drawn in unison, which increases the drawing speed remarkably. The larger the character size becomes and the more the number of characters included in the drawn pattern is increased, the faster the drawing speed becomes. However, as the character size is made larger, the beam current becomes larger in proportion to the area. This causes a problem: the beam gets blurred on the specimen due to a space-charge effect or a so-called Boersch effect. To prevent the beam current from increasing, it is necessary to lower the current density much more than in the VSB strategy. Changing the current density requires to adjust the electronic optical system, which needs complicated, time-consuming work.

To overcome this problem, a scan-projection strategy has been proposed in recent years (refer to, for example, Jpn. Pat. Appln. KOKAI Publication No. 2001-217173). The scan-projection strategy is to scan a plurality of characters formed on an EB (Electron Beam) mask with an electron beam and draw a pattern on the semiconductor specimen. Use of this strategy enables a large pattern to be drawn on the surface of the specimen without a large increase or decrease in the current density. Furthermore, with this strategy, a character of any size can be formed on the EB mask and the drawing speed will not decrease significantly.

When a character is drawn with an electron beam, dimensional errors occur due to a proximity effect or such a phenomenon as fogging. In the scan-projection strategy, dimensional errors can be corrected by dividing each character into a plurality of elements, transferring them, and changing the irradiation time of the beam from one divided element to another. The effective dose of the electron beam applied to each character is influenced by its surrounding characters or the drawing pattern. That is, there is little sense in determining the dose for each divided element, taking only each character in account. Instead, taking into account comprehensively the positions and sizes of a plurality of characters arranged in the drawing pattern, it is necessary to determine the distribution of the dose for the scanning position on a character basis. At present, however, no consideration has been given to what dose distribution is given to which pattern on the specimen (that is, what dose is given to the scanning position).

As described above, in the existing techniques, measures to correct the dose of beam for a position on the surface of the specimen taking the character distribution on the pattern into account have not been adopted. Therefore, it is impossible to optimize the dose distribution for each character and, therefore, the drawing dimensions of each character are difficult to correct sufficiently. Consequently, there is a possibility that the drawing accuracy will decrease. This disadvantage may be encountered not only with an electron beam writer but also with an ion beam drawer.

BRIEF SUMMARY OF THE INVENTION

An object of the present invention is to provide a charged-particle beam writer which causes the best dose distribution to be given for each character and the drawing dimensions to be corrected suitably and thereby improves the drawing accuracy.

According to an aspect of the present invention, there is provided a charged-particle beam writer which draws a pattern on a specimen with a charged-particle beam generated from a single particle generator by both of a VSB (variable-shaped beam) strategy and a scan-projection strategy, the charged-particle beam writer comprising: a data creating unit configured to create pattern data representing a state where a first-type figure drawn by the VSB strategy and a second-type figure drawn by the scan-projection strategy are arranged on the specimen; a computing unit configured to calculate, on the basis of the pattern data, the amount of correction for correcting the drawing dimensions of the first-type figure on the specimen and the drawing dimensions of the second-type figure on the specimen; and a control unit configured to control the dose of beam at each position on the specimen on the basis of the calculated amount of correction.

With the present invention, data corresponding to a character pattern (and data for drawing by the VSB strategy) is expanded on a specimen. On the basis of the expanded data obtained from the expansion, the optimum dose distribution at each position on the specimen is determined. According to the dose distribution, drawing is done by the scan-projection strategy. Specifically, the irradiation time of the charged-particle beam or the current density is changed at each position of the beam scanning, which causes the beam dose density to have a distribution in the same character pattern. This makes it possible to do drawing with the optimum dose of beam in the character pattern and further correct the amount of correction accurately for the correction of dimensional errors, such as the correction of a proximity effect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 shows the configuration of the optical system of an electron beam writer according to an embodiment of the present invention;

FIG. 2 is a plan view of the EB mask 18 in FIG. 1;

FIG. 4 shows an example of broken-down character data;

FIG. 5 shows the structure of EB mask data. In a memory 310a of the deflection control unit 310, data related to the EB mask 18 is stored in advance;

FIG. 6 shows a data structure of a pattern drawn by the scan-projection strategy;

FIG. 7 shows another data structure of a pattern drawn by the scan-projection strategy;

FIG. 8 shows an example of the data structure of the dose table;

DETAILED DESCRIPTION OF THE INVENTION

Figure 3:
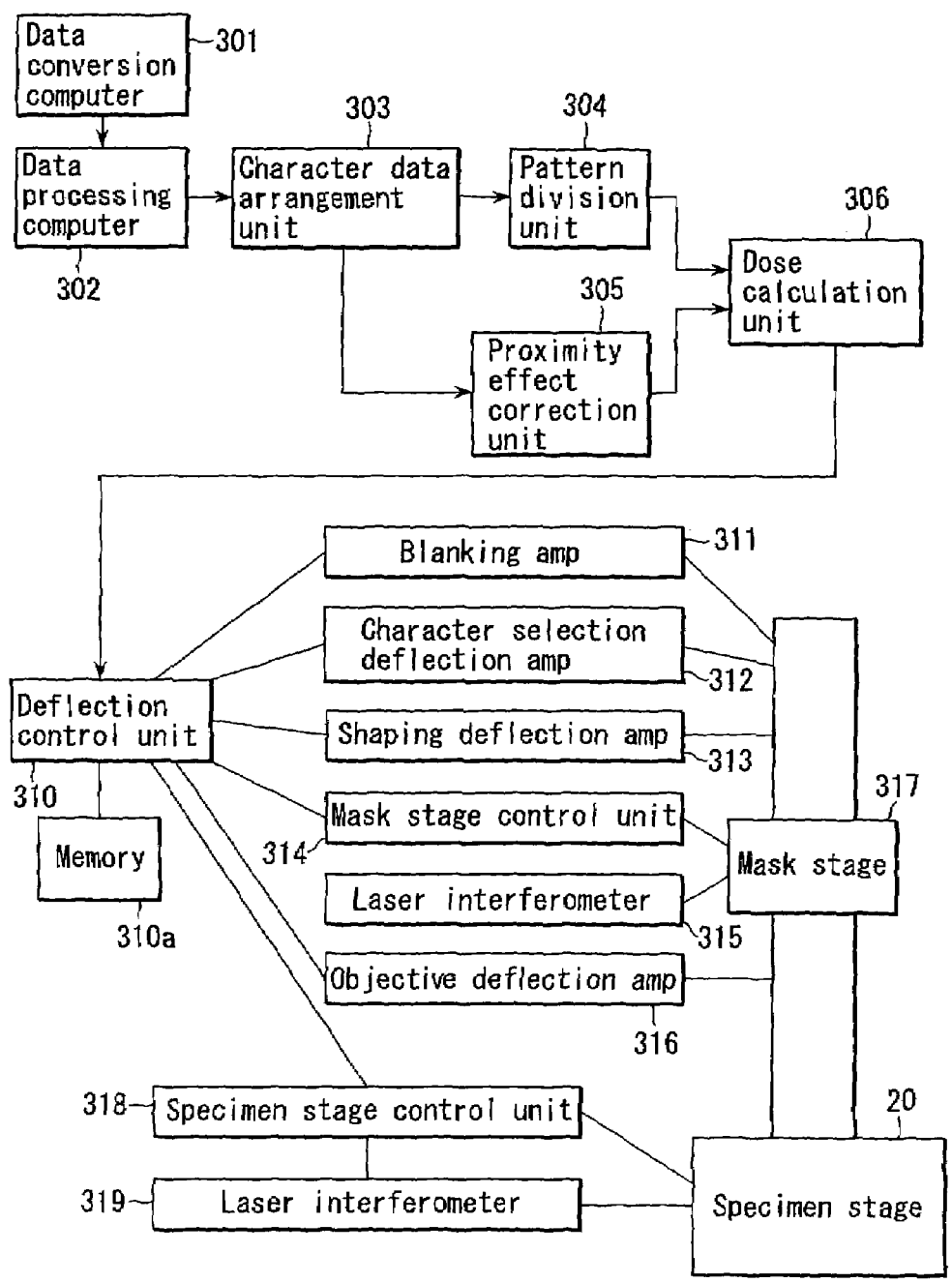
FIG. 3 is a functional block diagram of the electron beam writer of an embodiment of the present invention.

FIG. 1 shows the configuration of the optical system of an electron beam writer according to an embodiment of the present invention. In FIG. 1, numeral 11 indicates an electron gun (hereinafter, referred to as a gun 11) that produces an electron beam. Numeral 12 indicates a blanking deflector for providing on/off control of an electron beam. Numeral 13 indicates a shaping deflector for shaping a beam and selecting a character. Numeral 14 denotes a main objective deflector. Numeral 15 shows a sub-objective deflector. Numeral 16 indicates a blanking aperture mask. Numeral 17 shows a first shaping aperture mask with a rectangular aperture. Numeral 18 denotes a second shaping aperture mask with a plurality of apertures. Numeral 19 denotes a specimen. Numeral 20 shows a specimen stage. Numerals 21 to 24 indicate various types of lens systems.

An electron beam emitted from the gun 11 is projected onto the first shaping aperture mask 17 (hereinafter, referred to as the EB mask 17) via the blanking aperture 16. The aperture image of the EB mask 17 is formed on the second shaping aperture mask 18 (hereinafter, referred to as the EB mask 18). The image on the EB mask is formed on the specimen 19.

FIG. 2 is a plan view of the EB mask 18 in FIG. 1. As shown in FIG. 2, the EB mask 18 has a polygonal aperture 201 for producing a variable-shaped beam and a plurality of character apertures 202 composed of various characters. When the shaping deflector 13 has selected the polygonal aperture 201, the rectangular aperture formed by the EB mask 17 and the polygonal aperture 201 are overlapped with each other optically, which produces a rectangular or triangular beam. In this case, drawing is done by the variable-shaped beam strategy.

When the shaping deflector 13 has selected any one of the character apertures 202, the beam is scanned across the selected character aperture 202, which transfers the image of the character aperture 202 onto the specimen 19. In this case, drawing is done by the scan-projection strategy.

In the explanation, the shaping deflector 13 has the function of selecting either the polygonal aperture 201 or any one of the character apertures 202 and the function of scanning the beam. Instead of this, the aperture 201 and any one of the character apertures 202 may be selected by separate deflectors. Furthermore, to scan the beam across the aperture 202, a higher-speed deflector may be provided additionally.

FIG. 3 is a functional block diagram of the electron beam writer of the embodiment. In FIG. 3, a data conversion computer 301 gives CAD data to a data processing computer 302. The data processing computer 302 outputs the compressed data about a drawing pattern in a specific region on the surface of the specimen. The compressed drawing pattern data is decompressed by a character data arrangement unit 303. The character data arrangement unit 303 breaks down the data of the decompressed data into data items, including character codes (showing the kinds of characters), positions on the specimen, and length and breadth.

Characters to be drawn with VSB strategy are classified into one of a trapezoid and a parallelogram. In the trapezoid, its interior angle may include a right angle. Characters are further classified according to direction. A character code is given to each of the classified characters. A triangle and a rectangle are both classified as special cases of a trapezoid. For example, trapezoids are classified into eight kinds by combining two sides (the upper and the lower sides) and four rotation angles (rotation at intervals of 90°). Parallelograms are classified into eight kinds by combining two kinds in a mirror image reversal relationship and four rotation angles (rotation at intervals of 90°). Individual characters are classified by character codes distinguished in 16 ways (for example, distinguished by number 1 to number 16). Character codes 22 and later are allocated to the character drawn by the scan-projection strategy. The characters drawn by the scan-projection strategy are expanded into a scan pitch (px, py) related to a scanning process, the number of scans (Nscan), and deflection data (X, Y) on the specimen. A pattern division unit 304 breaks down the character data about the pattern to be drawn by the VSB strategy into five types of character code data showing the kinds of variable-shaped beam, data about the dimensions of the beam, and data about positions on the specimen.

FIG. 4 shows an example of broken-down character data. Character codes 17 to 21 are allocated to the characters drawn by the VSB strategy. The character codes 17 to 21 correspond to one rectangular beam and four kinds of isosceles right triangle beam.

A proximity effect correction unit 305 calculates the amount of correction for proximity effect correction on the basis of the data created by the character data arrangement unit 303. A dose calculation unit 306 determines the dose of beam on the base of the calculated amount of correction. This process will be explained in detail later.

The output of the dose calculation unit 306 is sent to a deflection control unit 310. The deflection control unit 310 controls a blanking amplifier 311, a character selection deflection amplifier 312, a shaping deflection amplifier 313, a mask stage control unit 314, an objective deflection amplifier 316, and a specimen stage control unit 318. The blanking amplifier 311 drives the blanking deflector 12. The character selection deflection amplifier 312 and shaping deflection amplifier 313 drive the shaping deflector 13. Here deflector 13 consists of two sets of deflection electrodes, for example. One is for character selection and another is for beam shaping. The shaping deflection amplifier 313 is used to obtain a variable-shaped beam. The character selection deflection amplifier 312 is used to select a character.

The mask stage control unit 314 drives a mask stage 317 on which an EB mask 18 is placed. The position of the mask stage 317 is measured by a laser interferometer 315. The measurement information is given to the mask stage control unit 314. The mask stage control unit 314 provides feedback control of the position of the mask stage 317. The objective deflection amplifier 316 drives the deflectors 14, 15.

The specimen stage control unit 318 drives the specimen stage 20 on which the specimen 19 is placed. The movement of the specimen stage 20 is measured by the laser interferometer 319. The measurement information is given to the specimen stage control unit 318. The specimen stage control unit 318 provides feedback control of the position of the specimen stage 317.

Next, a method of drawing a pattern in the apparatus shown in FIG. 3 will be explained. Hereinafter, a method of correcting the dose of beam in drawing a pattern on the surface of a specimen by using both of the VSB strategy and the scan-projection strategy will be explained in detail.

When drawing a character on the surface of a specimen by the VSB strategy, the deflection control unit 310 shapes an electron beam by use of a variable shaping pattern (polygonal aperture) 201 on the EB mask 18 and then projects the shaped beam onto the specimen 19. When drawing a character by the scan-projection strategy, the deflection control unit 310 selects any one of the character apertures 202 on the EB mask 18 and scans the electron beam across the selected character aperture 202, thereby transferring the pattern onto the specimen 19.

FIG. 5 shows the structure of EB mask data. In a memory 310a of the deflection control unit 310, data related to the EB mask 18 is stored in advance. The data is represented by, for example, a structure shown in FIG. 5. In FIG. 5, an EB mask code is caused to correspond to each address in the memory 310a. Each EB mask code includes the block position coordinates (XB, YB) of the character corresponding to the mask code in the EB mask 18 and the relative position coordinates (XF, YF) of the character in the block. On such data, the amount of deflection of the electron beam on the EB mask 18 is determined. In addition, for each character to be transferred, the pitch of the character, the number of scans, and the dose are determined. On the basis of the determined values, the character pattern is transferred onto the specimen 19.

When a character to be transferred is outside a shaping deflection region, the EB mask stage 317 is moved so that the character may be included in the shaping deflection region.

FIG. 6 shows a data structure of a pattern drawn by the scan-projection strategy. In FIG. 6, a pattern is divided into latticed sub-regions. The pattern density in each sub-region or information about the size and position of a representative character is caused to correspond to the coordinates on each EB mask 18. In addition, the total area S of the characters included in the pattern and the x-coordinate xG and y-coordinate yG of the center of gravity are caused to correspond to the coordinates on each EB mask 18. To simplify the explanation below, pattern density information is used.

The data processing computer 302 to proximity effect correction unit 305 carry out the process of breaking down characters and the process of making a correction to dimensional error factors (for example, proximity effect correction) and determines the optimum value of the dose of electron beam for each region. The dose is calculated on the basis of the pattern density distribution in each region. When a writer with an acceleration voltage of 50 keV is used, suppose a rectangular region is obtained by adding, for example, a 20-$\mu$m-wide region to the periphery of the rectangular region whose dose is to be calculated. The region is divided into sub-regions, each about 1 by 1 micrometers square. Next, the area where the pattern drawn by the VSB strategy belongs to each small region is determined, thereby forming a table that causes the areas to correspond to the corresponding patterns. Next, the area where the pattern is included in each small region is added to the table on the basis of the pattern area density related to the pattern data drawn by scanning.

The division regions of the data related to the scanning pattern do not necessarily coincide with the small regions. To overcome this problem, the data related to the scanning pattern is divided in units of, for example, 0.25 $\mu$m and the data is distributed on the basis of the areas where the division regions and the small regions overlap with one another. The pattern data included in the EB mask is stored in a memory (not shown) of the data processing computer 302 before drawing.

The format of the character data can be considered as follows. For example, a pattern to be transferred to an area of 20 $\mu$m$^2$ on the specimen is divided into 0.25 $\mu$m-lattice sub-regions, which creates data about the pattern area included in nx×ny=80×80=6400 lattices when px=py=0.25 $\mu$m. This data is stored in the memory so as to follow the address in which the character data is included.

FIG. 7 shows another data structure of a pattern drawn by the scan-projection strategy. The data format shown in FIG. 7 is such that each pattern is classified by the character included in the pattern and the number of characters n and their arrangement are shown for each pattern. The arrangement of the characters is defined by specifying the cardinal coordinates (x0, y0) of each of the character, the repetitive number of each of the character (nx, ny), and the pitch of each of the character (px, py).

The size of each character is made smaller than the small region 1 by 1 micrometers square. With the characters included in the pattern data placed on the specimen, the area data items are added to the small regions including the characters. When one character extends over different small regions, the data items are distributed to the individual small regions on the basis of the character area and the position of the center of gravity.

By the above processes, the whole data about the pattern area density distribution in each region is obtained. Next, on the basis of the obtained pattern area density, the dose for proximity effect correction is calculated. To do a corrective calculation, various known method may be used. For example, the method disclosed in Jpn. Pat. Appln. KOKAI Publication No. 9-289164 may be used.

FIG. 8 shows an example of the data structure of the dose table. In FIG. 8, (Nx, Ny) shows the number of the small regions included in the dose table. And (px, py) shows the pitch of the small regions included in the dose table. The results of corrective calculations are stored in the dose table as shown in FIG. 8. The dose table is a table that shows the dose for each small region. Data about the whole surface of the specimen may be stored in one dose table. Alternatively, data about a narrow region including the region currently being drawn may be stored in one dose table, which enables the memory to be saved.

When drawing is done, the dose is determined from the coordinates shown in the drawing data string and the result of the corrective calculation. In the VSB strategy, the coordinates on the surface of the specimen is caused to correspond to the dose table. Then, drawing is done with the dose given to the corresponding small region. The dose is discontinuous between adjacent small regions. Thus, in actual drawing, the dose is defined, centering on a small region. Then, the dose for another drawing point is determined by interpolating the doses for four adjacent small regions.

Figure 9:
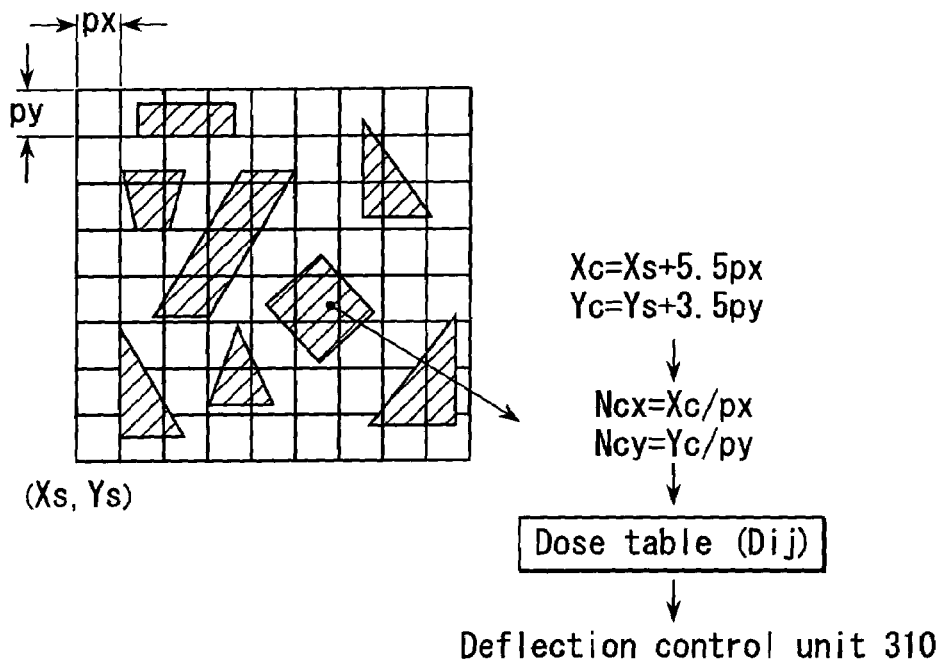
FIG. 9 shows how the scanning position on the surface of the specimen corresponds to the dose table.

FIG. 9, which shows how the scanning position on the surface of the specimen corresponds to the dose table, shows a case where a pattern is drawn on the surface of the specimen by the scan-projection strategy. In FIG. 9, to simplify the explanation, suppose the scanning pitch is equal to the pitch of data in the dose table.

On the beam position (Xc, Yc) on the pattern obtained by scanning, an address in the dose table is determined. From the address, the dose is determined. When (Px, Py) differs from the pitch of data in the dose table or when the lattice points where the dose table is defined slips relative to the lattice points of beam scanning, the points given in the form of (Xc, Yc) may not coincide with the lattice points in the dose table. In this case, the dose is determined by interpolation. Furthermore, a small table for scanning may be obtained in advance from the dose table. Then, the dose may be determined using the small table, which speeds up the reading of the dose.

In the scan-projection strategy, multiple scanning may be done. When multiple scanning is done, the dose is changed according to the degree of multiple. For example, when scanning is done four times, if the dose obtained from the dose table is D0, a first to third dose D1 to D3 are set to D0/4 and a fourth dose D4 is determined using the equation D4=D0−(D1+D2+D3). The reason why the way of determining D4 differs from the way of determining D1 to D3 is to decrease the influence of the omission of the characters below specific decimal places in calculations.

When the point where the dose is determined is shifted every scanning in multiple scanning, the dose is determined as follows. Let the dose obtained at the lattice point (i, j) from the dose table be Dij, any of the first to third dose D1$ij$ to D3$ij$ be equal to Dij/4, and the fourth dose D4$ij$ be D4$ij$=Dij−(D1$ij$+D2$ij$+D3$ij$). As a result, the dose at each point where the dose is to be determined can be determined.

Furthermore, there may be a case where not only a proximity effect but also dimensional fluctuations depending on a much wider pattern area distribution, such as a long-distance exposure effect (fogging effect) or a loading effect, should be corrected. In such a case, the amount of correction is calculated using data about the whole area of the scan transfer pattern, which enables the calculation efficiency to be increased. The amount of correction can be calculated by, for example, the method explained below.

First, by combining the correction of a proximity effect and the correction of a fogging effect and a loading effect, the dose density D(x) in each shot is determined so as to meet the following equation (1):

$$0.5 D(x)(w-\Delta(x))/w + \eta \int \sigma(x-x') D(x') dx' + \theta \int p(x-x') D(x') dx' = 0.5 D0 \quad (1)$$

To facilitate description in equation (1), let both x and x' be two-dimensional vectors. D0 is a reference dose. η and θ are a parameter representing the influence of a proximity effect and the influence of a long-distance photosensitive action, respectively. σ (x) and p(x) are a function of the spread of a proximity effect and a function of the spread of a long-distance photosensitive action, respectively. These are determined in advance experimentally.

Δ (x) represents a distribution of variations in the dimensions due to the dose (for example, resulting from a loading effect). Suppose Δ (x) is constant in a region about 1 by 1 millimeters square. Generally, the spread of a proximity effect σ (x) is about 10 micrometers. The spread of a long-distance photosensitive action p(x) is about several millimeters. When the influence of forward scattering is included in the spread of a proximity effect σ (x), σ (x) represents a distribution with a sharp peak in the middle.

The integration range on the left side of equation (1) is the pattern region of the whole mask surface. From the viewpoint of practical use, an integration range in a first integration including a (x–x') may be limited to a region with a radius of about 10 μm having point x in the center. In addition, an integration range in a second integration including q(x–x') may be limited to a region with a radius of about 30 mm having point x in the center.

To correct a proximity effect and a long-distance photosensitive action, for example, the following method can be considered. If D(x)=dp(x)×df(x) and if a change in df(x) is gentler than that in dp(x), equation (1) is approximated suitably by the following equation (2):

$$0.5\, dp(x)\, df(x)\{w-\Delta(x)\}/w + \eta\, df(x) \int \sigma(x-x')dp(x')dx' + \theta \int q(x-x')dp(x')df(x')dx' = 0.5\, D0 \quad (2)$$

dp(x) in equation (2) is determined so as to meet the following equation (3):

$$0.5 dp(x) + \eta w/\{w-\Delta(x)\} \int \sigma(x-x')dp(x')dx' = 0.5 \quad (3)$$

Under the condition given by equation (3), the remaining equation will be expressed as the following equation (4):

$$0.5\, df(x) + \theta w/\{w-\Delta(x)\} \int q(x-x')dp(x')df(x')dx' = 0.5 w/(w-\Delta(x)) D0 \quad (4)$$

In the integration included in equation (4), even if the integration range is 1 by 1 millimeters square and df(x) is constant in the range, there will be no large error in the calculations. The integration range is limited to within a region 1 by 1 millimeters square, the term including the integration in equation (4) is expressed by the following expression:

$$\Sigma q(x-xj) df(xj) \int dp(x')dx'$$

In the equation, j is a suffix denoting a region. As seen from the equation, the term including the integration in equation (4) is expressed by the sum of the terms including integration with respect to the individual regions.

When both sides of equation (3) are integrated in a region about 1 by 1 millimeters square, the part of the integral in the second term is expressed by the following double integration:

$$\int\int \sigma(x-x')dp(x')dx'dx$$

This is approximated suitably by the following expression:

$$\int dp(x')dx'$$

If the domain of integration with respect to x' is the region 1 by 1 millimeters square, this gives the following equation:

[0.5+ηw/{w−Δ(x)}]∫dp(x')dx'=0.5× (pattern area)

That is, ∫dp(x')dx'=0.5× (pattern area)/(0.5+ηw/(w−Δ(x))). Therefore, equation (4) is expressed by the following equation (5) with respect to the region i:

$$0.5\,df(xi) + \theta/[0.5 + \eta w/\{w - \Delta(x)\}]$$
$$\sum q(xi - xj)df(xj) \times 0.5 \times (\text{pattern area}) = 0.5w/\{w - \Delta(x)\}D0 \quad (5)$$

Producing simultaneous equations for the individual regions on the whole surface of the mask from equation (5) enables df(xi) to be determined. As for the region to be scan-transferred, use of the pattern area previously given as data about the EB mask makes it possible to increase the efficiency of calculating the pattern area of each small region.

With the above method, if the parameter representing the influence of a proximity effect is θ and the parameter representing the influence of a long-distance photosensitive action is η, and if the patern area of each region is known, df(xi) can be determined without requiring a fine pattern distribution (generally) needed to correct the proximity effect.

To summarize what has been described above, the distribution of df(x) is determined in advance. The result is stored in memory means or the like. When drawing is done, dp(x) is calculated with respect to the vicinity of the drawing region by the aforementioned method. Then, dp(x) is multiplied by the value of df(x) of the corresponding region. As a result, it is possible to calculate the amount of correction that can correct all of the influence of a proximity effect, the influence of a long-distance photosensitive action, and the influence of a loading effect.

As described above, with the embodiment, when a pattern is drawn on the surface of a specimen by using both of the scan-projection strategy and the VSB strategy, it is possible to determine the optimum dose of beam after combining the scan transfer pattern data and the drawing pattern data. As a result, it is possible to determine the dose of beam accurately by correcting the proximity effect and the like throughout the whole region. Accordingly, the optimum dose distribution is given to the character pattern, thereby correcting the dimensions of the character pattern, which improves the drawing accuracy.

The present invention is not limited to the above embodiment. In the embodiment, an example of using both of the VSB strategy and the scan-projection strategy has been explained. The invention may be applied to a case where the whole region of the surface of the specimen is drawn by the VSB strategy or a case where the whole region is drawn by the scan-projection strategy.

Furthermore, the present invention may be applied to a case where the dimensions of a drawing pattern by the scan-projection strategy are not constant. In addition, the invention may be applied to ordinary character projection drawing, provided that the scan pitch is set to one in both of the x direction and the y direction. Moreover, the invention may be applied to a case where a pattern has only to be scanned partially, depending on the pattern, without scanning the entire surface of the character aperture 202.

Furthermore, it may be convenient to define a pattern on the surface of a specimen redundantly by using character data and VSB data and create drawing data. This will be explained by reference to FIG. 10.

Figure 10:
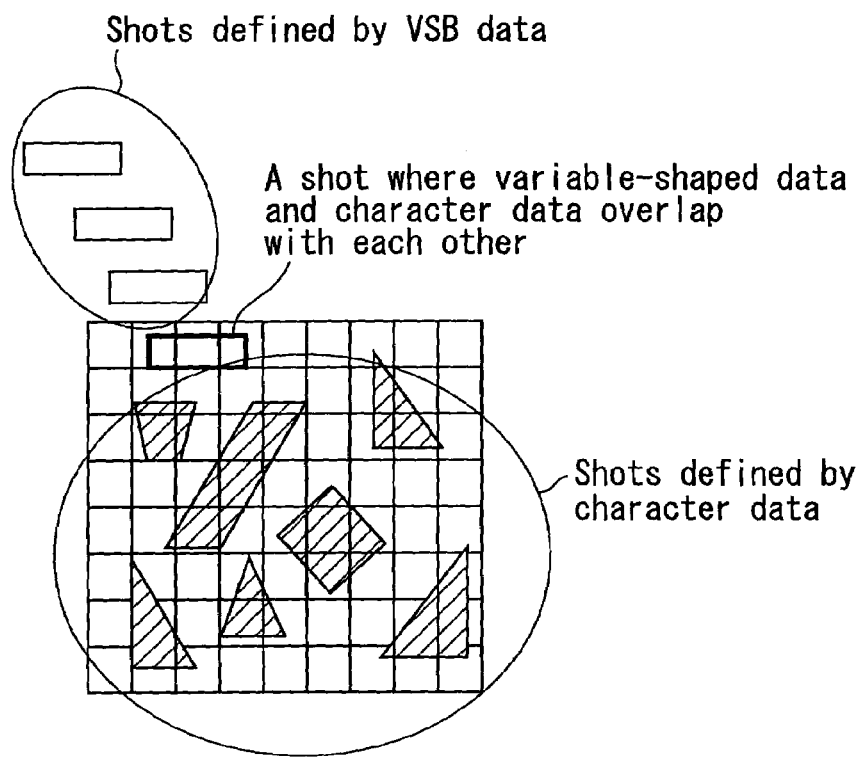
FIG. 10 shows a state where a certain shot is defined by character data and VSB data redundantly.

FIG. 10 shows a state where a certain shot is defined by character data and VSB data redundantly. A case where such a shot appears will be explained below.

At rows 21–40 of the VSB pattern data, flag data indicating whether an overlap with another pattern is present, flag data indicating the number of overlaps are added, and outline data about the overlap part are added at rows 41–52. When VSB pattern data is created, a check is made to see if the pattern to be drawn is included in the region where the character data has been defined (for example, the region 20 by 20 micrometers square). Then, if the VSB pattern data is found in the region where the character data has been defined, a check is made to see if there is an overlap with the character data with respect to the VSB pattern data.

As a result, if an m number of overlaps have been found, following the pattern data, data about a point defining the outline of the overlap part is added. For the data showing the outline, the number of outline points, the coordinates of a first outline point, and the relative coordinates of each outline point with respect to the first outline point are defined.

Using such data items, drawing is done as follows. After decompressing the drawing data, the character data arrangement unit 303 interprets the flag data to check to see if there is an overlap between patterns. If there is an overlap between patterns, the character data arrangement unit 303 creates small pattern data by removing the overlapping part from the VSB pattern data and discards the original pattern data including the overlap. On the basis of the corrected data obtained as described above, the proximity effect is corrected and drawing is done.

While in the embodiment, the explanation has been given taking an electron beam writer as an example, the present invention may be applied to an ion beam writer in a similar manner. Furthermore, this invention may be practiced and embodied in still other ways without departing from the spirit or essential character thereof.

What is claimed is:

1. A charged-particle beam writer which draws a pattern on a specimen with a charged-particle beam generated from a single particle generator by both of a VSB (variable-shaped beam) strategy and a scan-projection strategy, the charged-particle beam writer comprising:

a data creating unit configured to create pattern data by combining first figure data and decompressed second figure data, said pattern data representing a state where a first figure defined by the first figure data and drawn by the VSB strategy and a second figure defined by the second figure data and drawn by the scan-projection strategy are arranged on the specimen;

a computing unit configured to calculate, on the basis of the pattern data, the amount of correction for correcting the drawing dimensions of the first figure on the specimen and the drawing dimensions of the second figure on the specimen; and a control unit configured to control the dose of beam at each position on the specimen on the basis of the calculated amount of correction.

2. The charged-particle beam writer according to claim 1, wherein the control unit controls the irradiation time of the charged-particle beam for each position on the specimen.

3. The charged-particle beam writer according to claim 1, wherein the particle generator generates as much a charged-particle beam as corresponds to the current supplied to the particle generator, and the control unit controls the current density of the supplied current for each position on the specimen.

4. The charged-particle beam writer according to claim 1, wherein the computing unit calculates the amount of correction on the basis of a pattern density distribution on the specimen.

5. The charged-particle beam writer according to claim 1, wherein the control unit, when there is a part of the specimen on which the first figure and the second figure overlap with each other, controls the dose of beam by the VSB strategy and the dose of beam by the scan-projection strategy separately at the overlapping part.

6. The charged-particle beam writer according to claim 1, wherein the control unit, when multiple scanning is done by the scan-projection strategy, controls the dose of beam based on the number of multiple scannings at each position on the specimen.

7. The charged-particle beam writer according to claim 1, further comprising:

a first shaping aperture with a rectangular aperture; and a second shaping aperture with a polygonal aperture and a plurality of character apertures, wherein a variable-shaped beam is formed by an optical overlap between the rectangular aperture and the polygonal aperture and a character beam is formed by selecting one of the character apertures.

8. The charged-particle beam writer according to claim 1, wherein a part of the second figure is scanned by the scan-projection strategy.

* * * * *